Figure 1:
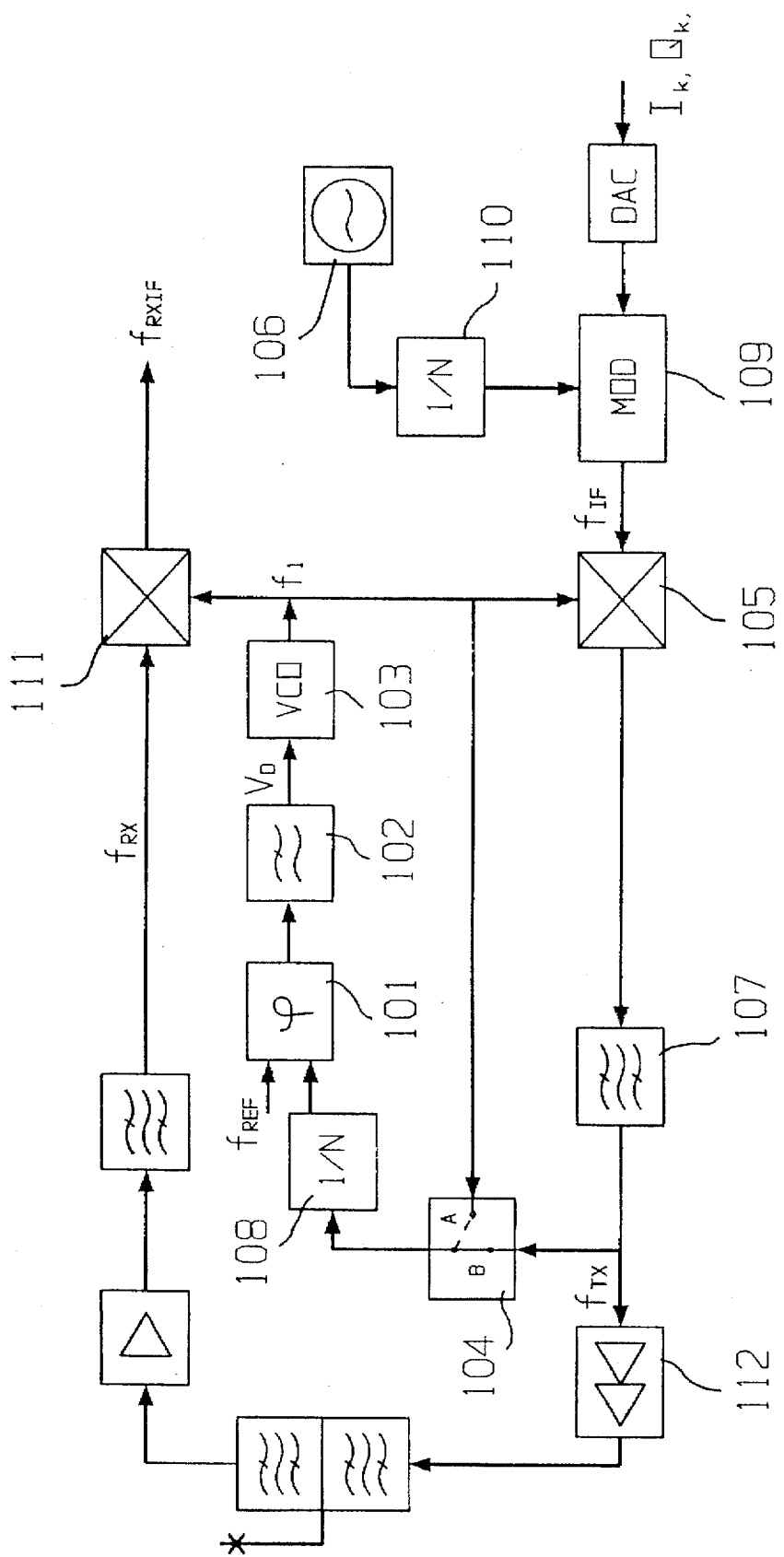

United States Patent [19]
Hulkko et al.

[11] Patent Number: 5,740,521
[45] Date of Patent: Apr. 14, 1998

[54] METHOD AND CIRCUIT FOR CREATING FREQUENCIES FOR A RADIO TELEPHONE

[75] Inventors: Jaakko Hulkko, Oulu; Merja Vuolteenaho, Helsinki, both of Finland

[73] Assignee: Nokia Mobile Phones Ltd., Salo, Finland

[21] Appl. No.: 555,012

[22] Filed: Nov. 13, 1995

[30] Foreign Application Priority Data

Nov. 14, 1994 [FI] Finland ................................. 945343

[51] Int. Cl.$^6$ ................................................. H04B 1/40
[52] U.S. Cl. ............................ 455/76; 455/113; 455/553
[58] Field of Search ................................ 455/75, 76, 78, 455/84, 85, 86, 87, 89, 553, 93, 112, 113, 118, 119, 260; 375/216

[56] References Cited

U.S. PATENT DOCUMENTS

| | | | |
|---|---|---|---|
| 3,660,781 | 5/1972 | Tewksbury et al. | 331/1 A |
| 4,449,250 | 5/1984 | Kurby | 455/76 |
| 5,291,474 | 3/1994 | Ikonen et al. | 455/76 |
| 5,301,367 | 4/1994 | Heinonen | 455/76 |
| 5,390,168 | 2/1995 | Vimpari | 370/30 |
| 5,422,931 | 6/1995 | Austin-Lazarus et al. | 455/86 |
| 5,423,075 | 6/1995 | Boese et al. | 455/86 |
| 5,483,679 | 1/1996 | Sasaki | 455/86 |
| 5,574,986 | 11/1996 | Mobach | 455/76 |

FOREIGN PATENT DOCUMENTS

| | | |
|---|---|---|
| 0 621 683 | 10/1994 | European Pat. Off. . |
| 3-98325 | 4/1991 | Japan ................................. 455/75 |

OTHER PUBLICATIONS

DE 36 44066 A1 Patent Abstract, Feb. 11, 1988, International Mobile Machines Corp., Germany.
FI 91821 Patent Abstract, Apr. 29, 1994, Nokia Matkapuhelimet Oy, Finland.

Primary Examiner—Reinhard J. Eisenzopf
Assistant Examiner—Lester G. Kincaid
Attorney, Agent, or Firm—Perman & Green, LLP

[57] ABSTRACT

In the frequency synthesizer, the stable transmission frequency required by the digital operating mode is created from a frequency produced by a free running oscillator and which includes frequency errors. A local frequency ($f_1$) and an intermediate frequency ($f_{IF}$) including frequency errors are input to a mixer (105) located in the signal path of the transmitter. A transmission frequency transmission signal ($f_{TX}$) is input to a phase-lock loop with a voltage-controlled oscillator (103) that produces the local frequency ($f_1$). Thereby the frequency error caused by the intermediate frequency ($f_{IF}$) can be corrected with the local frequency ($f_1$) by adjusting the voltage-controlled oscillator (103) of the loop with a voltage ($V_D$) that is proportional to the phase difference between the transmission frequency signal and a reference signal ($V_{REF}$) input to a phase comparator. This is implemented by connecting the mixer (105) to the loop during the transmission time period with a controllable switch (104), for example. The local frequency ($f_1$) of the receiver is produced with the frequency synthesizer described in the present invention by disconnecting the mixer (105) from the loop. The invention can be applied in producing frequencies for radio telephones that include dual-mode operating modes and exclusively digital operating modes.

11 Claims, 4 Drawing Sheets

METHOD AND CIRCUIT FOR CREATING FREQUENCIES FOR A RADIO TELEPHONE

The present invention is directed to a method and circuit for producing frequencies for a radio telephone having at least a digital operating mode based on time-division technology.

A dual-mode radio telephone includes both an analog and a digital operating mode. In the digital operating mode, as in digital mobile phones in general, local frequencies are usually produced with a phase-lock loop that is locked in to a reference frequency. This assures sufficiently good frequency stability for transmitting and receiving a phase-modulated signal within specified error limits. Modulation methods generally used in analog radio telephones, such as FM modulation, do not place the same types of requirements on the frequency stability of the frequency synthesizer. The required frequencies can be produced with a free running oscillator, such as a crystal oscillator.

Naturally, in dual-mode telephones the aim is to realize the requirements of both operating modes with as simple a synthesizer structure as possible to achieve important design goals: small size, minimal current consumption and low manufacturing costs. However, the different nature of the operating modes is problematic: the digital operating mode is time-divided and the analog operating mode is continuous. Usually, stable local frequencies required by the digital operating mode, like the local frequencies of the analog operating mode, have to be produced separately for VHF frequencies. In principle, the local frequencies of both the transmitter and the receiver in a time-division system can easily be produced with the same frequency synthesizer construction by causing a frequency hop in the synthesizer, whereby the frequency is changed between the transmission and reception time periods. It is not possible to use the same synthesizer in this manner in a continuously operating system, because transmission and reception occur simultaneously at different frequencies. A crystal oscillator and, if necessary, frequency dividers or multipliers are customarily added to the transmitter or receiver of a dual-mode radio device to produce the local frequency required in the analog operating mode, which cannot be produced with a phase-lock synthesizer, due to the continuous nature of the operation.

Due to the reasons presented above, frequency synthesizer constructions of dual-mode radio telephones are often complicated and space-consuming. Current consumption and manufacturing costs also grow due to the large number of components involved, particularly several phase-lock loops (PLL) and voltage-controlled oscillators (VCO).

The object of the present invention is to realize a simple frequency synthesizer construction that is suitable for producing frequencies for dual-mode radio telephones in both analog and digital operating modes. The present invention can be implemented to reduce the manufacturing cost, size and current consumption of the rf module of a dual-mode telephone.

In a frequency synthesizer according to the present invention, the phase-locked transmission frequency required by the digital operating mode is created from the frequency produced by a free running oscillator, which contains frequency errors. In the present invention, a local frequency and an intermediate frequency containing frequency errors are input to a mixer in the signal path of the transmitter. Part of the transmission frequency output signal of the mixer is input to a divider located in front of a phase comparator of a phase-lock loop that produces the local frequency. Thereby the frequency error that the intermediate frequency causes in the transmission frequency can be corrected in the local frequency by adjusting a voltage-controlled oscillator (VCO) of the loop with a voltage proportional to the phase difference between the transmission frequency signal and a reference signal that is input to the phase comparator. This is implemented by connecting the mixer to the loop during the transmission time period with a controllable switch, for example. The local frequency of the receiver is produced with the frequency synthesizer of the present invention by disconnecting the mixer from the loop, whereupon the output frequency of the VCO is input to the divider located in front of the phase comparator. As a result, the loop functions as a local frequency synthesizer, as is known, and the mixer functions conventionally as a mixer. The transmission frequency is obtained from the output of the mixer. Modulation can be implemented with either the intermediate frequency or the carrier frequency. The present invention makes it possible to replace the VHF synthesizer typically used as the offset oscillator of the transmitter with a low-cost free running oscillator that requires minimal room on a circuit board and is noise tolerant.

In one advantageous embodiment, a frequency synthesizer according to the present invention is used to produce the local frequency of a direct conversion receiver when the receiver is used to indicate transmission power, which is implemented with a power regulating technique described in FI patent application 945344 filed simultaneously with the present application by the present applicant. In said technique, part of the transmission that is input to the receiver is mixed to the base band frequency for the purpose of indicating transmission power. A transmission frequency local frequency, which is obtained from the input of a divider located in front of a phase comparator of a phase-lock loop of the present invention when a mixer is connected to the loop, is input to the receiver for mixing.

The present invention is described in detail below, with references to the enclosed drawings.

Figure 2:
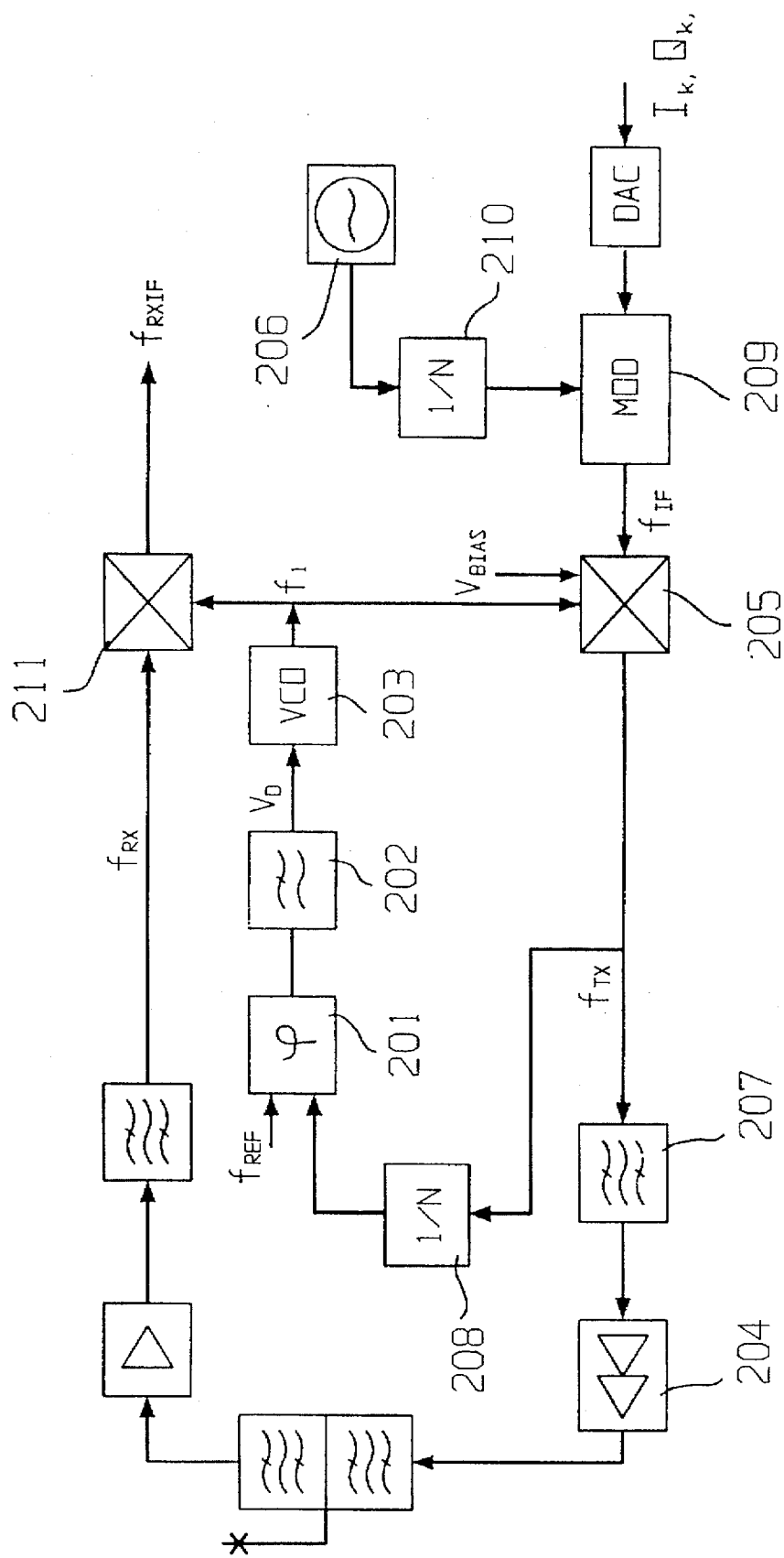
Figure 3:
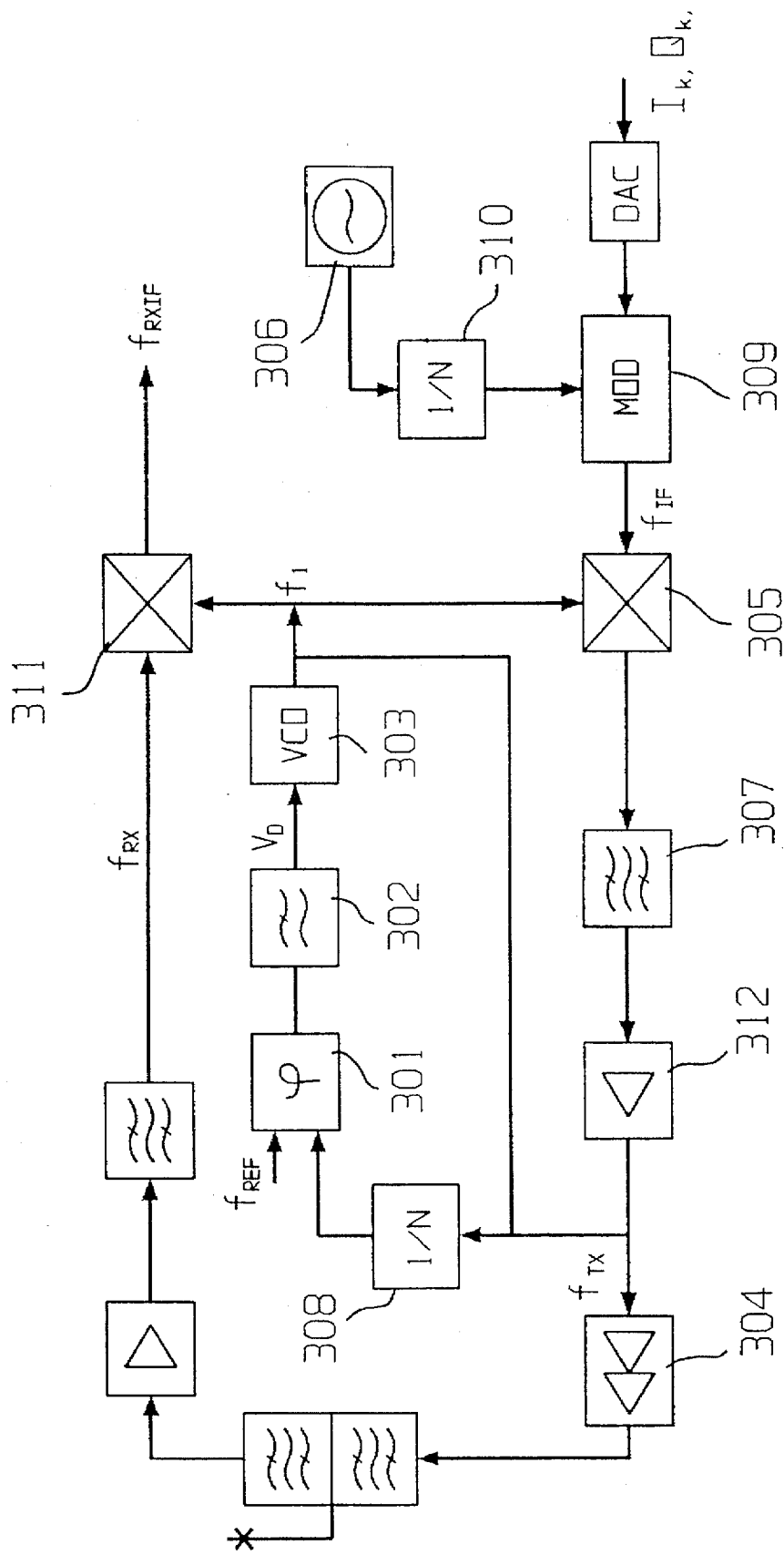
Figure 4:
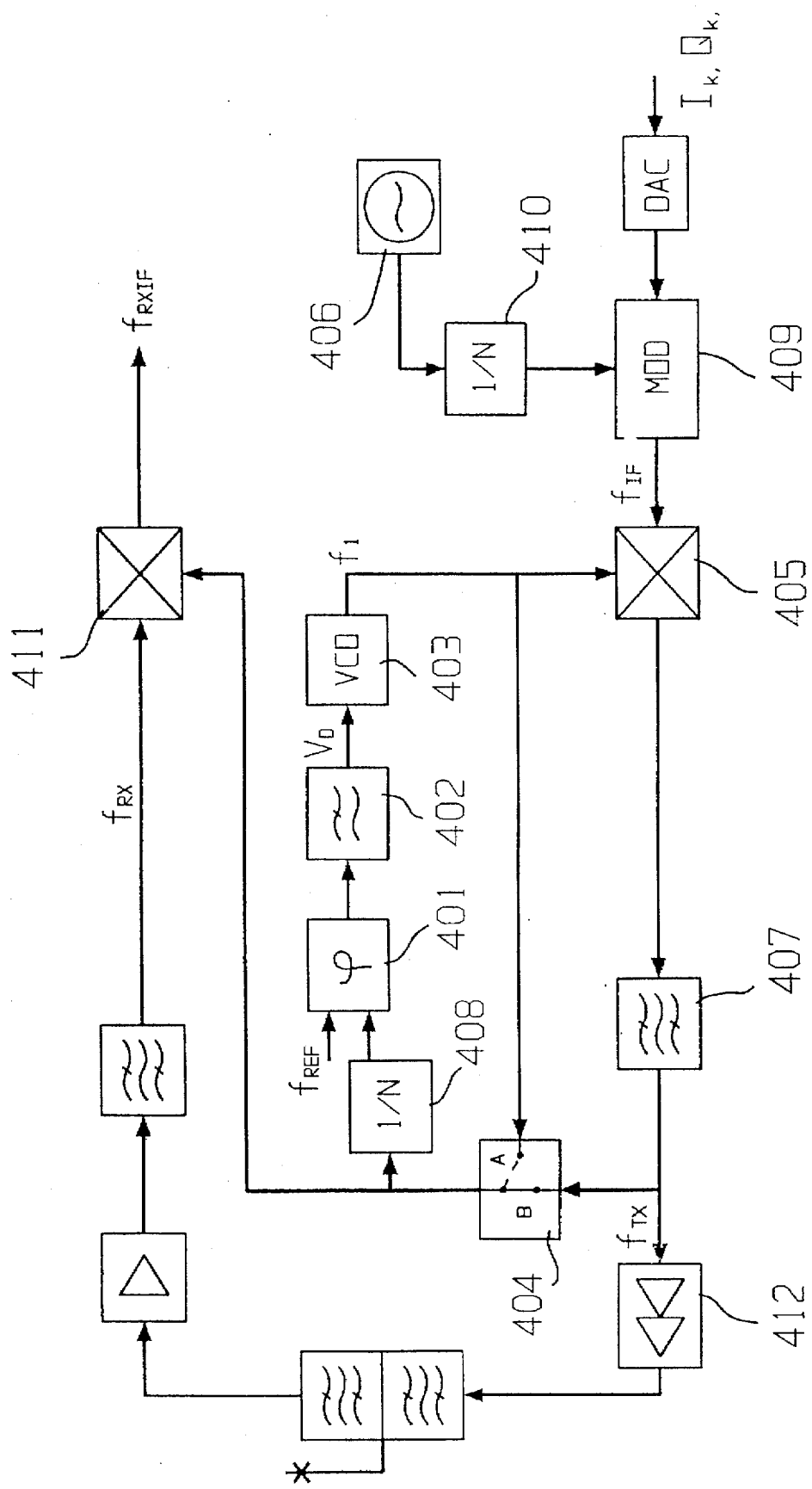

FIG. 1 shows an advantageous embodiment of the present invention in a radio device, FIG. 2 shows a first alternative embodiment of the embodiment shown in FIG. 1, FIG. 3 shows a second alternative embodiment of the embodiment shown in FIG. 1 and FIG. 4 shows a frequency synthesizer according to the present invention as applied to power indication with the help of a receiver.

In the radio device shown in FIG. 1, the same frequency synthesizer construction described in the present invention is used to produce local frequencies for both the transmitter and the receiver. The synthesizer is based on a phase-lock loop made up of a phase comparator 101, a loop filter 102, a voltage-controlled oscillator 103 (VCO) and a divider 108, and with the help of a controllable switch 104, also a mixer 105 and a bandpass filter 107, which are located in the transmitter's signal path. When the switch 104 is in position A, the mixer 105 and the bandpass filter 107 are disconnected from the loop, and correspondingly, when the switch is in position B, they form part of the phase-lock loop.

When the switch 104 is in position B, part of the transmission frequency $f_{TX}$, mixed in 105 with a carrier frequency, is input to the phase-lock loop. A voltage $V_D$, which is proportional to the frequency difference between the transmission frequency $f_{TX}$, which is divided by the divider 108, and a reference frequency $f_{REF}$, adjusts the voltage-controlled oscillator 103, correcting the local frequency $f_1$ to compensate for the frequency error of the transmission signal. An intermediate frequency $f_{IF}$ can therefore be produced with a free running oscillator 106. Unnecessary frequencies are eliminated from the result of the mixing with the channel filter 107.

The phase-locked transmission signal $f_{TX}$ required by the digital operating mode of a dual-mode radio device can therefore be produced with the circuit shown in FIG. 1 when the switch 104 is in position B. Because the digital operating mode is time-divided, the receiver's local frequency $f_1$ is produced by switching the switch 104 to position A for the duration of the reception time period and changing the divisor of the divider 108 in the loop, so that dividing the frequency to be locked with said divisor will correspond to the reference frequency $f_{REF}$. During reception the components belonging to the transmission chain, such as the mixer and the free running oscillator, can be turned off to minimize current consumption.

In the analog operating mode it is advantageous for the switch 104 to be in position A during transmission and reception, assuring that the frequency of the transmission frequency $f_{TX}$ will be sufficiently stable. Compensation of the frequency error of the free running oscillator 106 with the help of the phase-lock loop when the switch is in position B causes an equally large error in the output frequency $f_1$ of the VCO 103, which is input to a mixer 111 of the receiver. The stability of the frequency of the free running oscillator 106 can be designed to be adequate for indicating the most commonly used forms of modulation, such as FM modulation, in the analog operating mode. A sufficiently stable frequency can be obtained by using a crystal or a SAW resonator, for example, to implement the free running oscillator.

A modulator 109 in FIG. 1 operates at the intermediate frequency $f_{IF}$ produced by the free running oscillator. The modulator can also be located in the phase-lock loop or outside the loop, at the transmission frequency, for example. When the signal containing modulation is input to the phase-lock loop as shown in FIG. 1, the loop must be designed to be slow enough to prevent the voltage-controlled oscillator 103 (VCO) from changing its output frequency according to the modulation, which would filter the modulation from the transmission frequency $f_{TX}$. The speed of the loop can be controlled with the design of the loop filter 102. A slow loop is also advantageous because it will minimize swings in the output frequency $f_1$ of the VCO 103 caused by changes in the position of the switch 104 or changes in the divisor of the divider 108. If system specifications include functions requiring quick changes in frequency, such as the MAHO (Mobile Assisted Hands Off) measurements in the North American DAMPS network, the speed of the loop can be increased by using a phase comparator with a fast switch, if necessary.

The present invention can also be realized according to FIG. 2 without a separate switching component. This embodiment is based on the characteristic of a phase comparator 201 that allows it to select the input signal with the highest level. The frequency to be locked can therefore be changed without a switch by amplifying the level of the desired mixed frequency in relation to all other frequncies. This can be implemented by using a single side band (SSB) mixer as a mixer 205 and removing a channel filter 207 from the loop. In the analog operating mode and the transmission time period of the digital operating mode, the mixer 205 attenuates the mirror frequency of the transmission frequency $f_{TX}$, whereupon the phase comparator selects the transmission frequency signal $f_{TX}$ for locking. In the reception time period of the digital operating mode the mixer 205 is disconnected from the loop. This can be implemented by shutting off a free running oscillator 206 and biasing the mixer with a separate control signal $V_{BIAS}$ to make it conductive/amplifying, whereupon the frequency synthesizer will lock in to the local frequency $f_1$.

In the implementation shown in FIG. 2, the transmission frequency $f_{TX}$ is phase-locked with the loop of the present invention also in the analog operating mode. As a result, the frequency of the local frequency $f_1$, which is input to a mixer 211 of the receiver, changes with the frequency of the free running oscillator 206, which is corrected by the present invention in the transmitter. This does not cause problems in the FM indication of the receiver.

FIG. 3 shows an embodiment of the present invention in which the switching function differs from the previous embodiment in that it is implemented with a conventional mixer 305, with the addition to the loop of a channel filter 307 and an amplifier 312, which belong to the transmitter. In the analog operating mode and during the transmission period of the digital operating mode the transmission frequency $f_{TX}$, which is filtered from the mixing result with the bandpass filter 307, is amplified with the amplifier 312, whereupon the level of the transmission frequency $f_{TX}$ is higher than the level of the local frequency $f_1$, which is output by a VCO 303. The loop therefore locks in to the transmission frequency $f_{TX}$. During the reception time period of the digital operating mode, the whole transmitter chain can be shut off to reduce current consumption, whereupon the loop functions conventionally, locking in to the local frequency $f_1$ output by the VCO 303.

FIG. 4 shows an embodiment of the present invention. It differs from the previously presented embodiments in that the local frequency of the receiver is input to a mixer 411 from the input signal of a divider 408 of the loop, having transmission frequency $f_{TX}$ when a mixer 405 is connected to the loop and local frequency $f_1$ when the mixer 405 is disconnected from the loop. A frequency synthesizer according to this circuit can be used in output power indication that happens with the help of a direct conversion receiver, which is based on the power control method described in the patent application submitted with the present application. When the mixer 405 is part of the loop, the transmission input to the receiver can be indicated according to said method by inputting the transmission frequency to the mixer 411 as a local frequency. When the method is applied to the digital operating mode, a switch 404 is in position B during transmission. In the analog operating mode the switch 404 is switched from position A to position B at a selected moment for power indication. In principle, the embodiment shown in FIG. 4 can also be realized by using the switching implementations of the embodiments shown in FIGS. 2 and 3.

According to the embodiments shown in FIGS. 1, 2, 3 and 4, a synthesizer that produces the frequencies required by both the analog and digital operating modes of a dual-mode radio telephone can be implemented with only a few components. The intermediate frequency of the transmitter can be produced with a relatively inexpensive and noise tolerant free running oscillator, while producing the phase-locked transmission frequency required by the digital operating mode with the feedback connection of the transmission signal into the phase-lock loop according to the present invention.

For example, when applying a radio telephone based on a direct conversion receiver according to the embodiments shown in FIGS. 1, 2, 3 or 4 to the dual-mode DAMPS system of North America, the free running oscillator 106, 206, 306, 406 can be implemented with a 90 MHz crystal, whose output frequency is divided by the divide-by-2-divider 110, 210, 310, 410 for modulation, whereupon the intermediate frequency $f_{IF}$ is 45 MHz, corresponding to the required duplex separation. When the 869–894 MHz receiver frequency, which is input to the mixer 111, 211, 311, 411 of the direct conversion receiver, is adjusted with the help of the reference frequency $f_{REF}$ and the divider 108, 208, 308, 408 to get output frequency $f_1$ of the voltage-controlled oscillator 103, 203, 303, 403 of the phase-lock loop, the transmission frequency $f_{TX}$ is obtained from the difference between the VCO output frequency $f_1$ and the intermediate frequency $f_{IF}$, which is 824–849 MHz according to the DAMPS specification.

The frequency synthesizer of the present invention combines the goals of rf design: small size, minimal current consumption, improved noise tolerance and low manufacturing costs. When the intermediate frequency of the radio telephone is produced according to the present invention with a free running oscillator, better noise tolerance is achieved than with a VHF synthesizer based on a prior art phase-lock loop, in which noise appearing in the control voltage of the voltage-controlled oscillator affects the output frequency of the loop. The present invention makes it possible to minimize current consumption, even though the separate changeover switch 104 shown in FIG. 1 is added to the loop. The current consumption of the switch is only a few microamperes, which is a fraction of the current consumption of a typical phase comparator, for example.

The synthesizer construction described in the present invention can naturally be applied to completely digital telephones. The present invention is not in any way limited to the examples presented above, but is applicable to the extent allowed in the accompanying claims.

We claim:

1. A method for producing frequencies for a dual-mode radio telephone having a transmitter and a receiver, the dual-mode radio telephone operating in a digital reception and a digital transmission modes and an analog reception and an analog transmission modes and using a phase-locked loop (PLL) as a common frequency synthesizer and a free running oscillator as a frequency source, comprising the steps of:

when transmitting, deriving an intermediate frequency ($f_{IF}$) from the free running oscillator;

deriving a local frequency ($f_1$) from a voltage-controlled oscillator of the PLL, the voltage-controlled oscillator being regulated by a phase comparator having a reference frequency ($f_{REF}$) as a first input to the phase comparator;

applying to a mixer of the transmitter the intermediate frequency ($f_{IF}$), for mixing with the local frequency ($f_1$) for producing a transmission frequency ($f_{TX}$);

in the digital transmission operating mode, deriving an effective second input of the phase comparator from the transmission frequency ($f_{TX}$), for compensating instabilities of the free running oscillator;

in the analog transmission operating mode, deriving the effective second input of the phase comparator from the local frequency ($f_1$);

when receiving, applying to a mixer of the receiver a carrier frequency ($f_{RX}$), for mixing with the local frequency ($f_1$) for producing a down-converted receiver frequency signal; and in the digital and the analog reception operating modes, deriving the effective second input of the phase comparator from the local frequency ($f_1$).

2. The method according to claim 1, wherein the receiver is based on direct conversion.

3. The method according to claim 2, wherein the receiver is used to indicate transmission power, and during the indication of transmission power, the effective second input of the phase comparator is derived from the transmission frequency ($f_{TX}$) and the local frequency ($f_1$) is applied to the receiver.

4. A circuit for producing frequencies for a dual-mode radio telephone that operates in a digital reception and a digital transmission modes and an analog reception and an analog transmission modes, comprising:

transmitter;

a receiver;

a first mixer disposed in said transmitter having a first input for receiving an intermediate frequency ($f_{IF}$), and a second input for receiving a local frequency ($f_1$), wherein said first mixer outputs a transmission frequency ($f_{TX}$);

a second mixer disposed in said receiver having a first input for receiving a carrier frequency ($f_{RX}$), and a second input for receiving said local frequency ($f_1$), wherein said second mixer outputs a down-converted receiver frequency signal;

a free running oscillator for producing said intermediate frequency ($F_{IF}$);

a phase-locked loop (PLL) circuit for producing said local frequency ($f_1$), the PLL having a feedback input;

control means having a first mode and a second mode, for controlling the effective feedback input of the PLL;

in said digital transmission operating mode, said control means is disposed in said first mode to connect said output of said first mixer and thus said transmission frequency ($f_{TX}$) into said feedback input of said PLL;

in said analog transmission operating mode, said control means is disposed in said second mode to effectively disconnect said output of said first mixer and thus said transmission frequency ($f_{TX}$) from said feedback input of said PLL; and in said digital and said analog reception operating modes, said control means is disposed in said second mode to effectively disconnect said output of said first mixer and thus said transmission frequency ($f_{TX}$) from said feedback input of said PLL.

5. A circuit according to claim 4, wherein said control means is a switch.

6. A circuit according to claim 5, wherein said switch is a controllable changeover switch (104, 404) having a first port, a second port and a third port, said first and said second ports providing alternative input paths to said PLL, if engaged said first port of said switch receives said transmission frequency ($f_{TX}$) and connects said first mixer (105, 405) to said PLL, if engaged said second port of said switch connects said output of the voltage-controlled oscillator (103, 403) to said PLL thus disconnecting said first mixer (105, 405) from said PLL, and said third port of said switch passes said engaged input path to said PLL.

7. A circuit according to claim 6, wherein a bandpass filter (107, 407) is connected to said output of said first mixer (105, 405) to filter said transmission frequency ($f_{TX}$) to a specified band of frequency.

8. The circuit according to claim 5, characterized in that the switch is implemented with a phase comparator (201, 301) having an input for receiving the transmission frequency ($f_{TX}$) and connecting the mixer to the loop when the level of the transmission frequency ($f_{TX}$) is higher than the level of the local frequency ($f_1$), and for receiving the local frequency ($f_1$) and disconnecting the mixer (205, 405) from the loop when the level of the local frequency ($f_1$) is higher than the level of the transmission frequency ($f_{TX}$).

9. The circuit according to claim 8, characterized in that the mixer is implemented with a single side band (SSB) mixer whose output is connected to the input of the divider (208), whereupon the mirror frequency side band of the transmission frequency ($f_{TX}$) is attenuated with the mixer to amplify the transmission frequency in relation to all other frequencies.

10. The circuit according to claim 8, characterized in that the output of the mixer (305) is connected via at least the bandpass filter (307) and an amplifier (312) to the input of the divider (308), and the output of the voltage-controlled oscillator (303) is connected to the input of the divider (308), whereupon the transmission frequency ($f_{TX}$) is separated from the mixing result with the bandpass filter (307) and input to the amplifier (312) to amplify it in relation to all other frequencies, and the transmitter is disconnected from operation to amplify the local frequency ($f_1$) in relation to all other frequencies.

11. A circuit according to claim 4, wherein said receiver is based on direct conversion.

* * * * *